United States Patent
Yun et al.

(10) Patent No.: US 6,914,316 B2
(45) Date of Patent: Jul. 5, 2005

(54) SEMICONDUCTOR TRENCH ISOLATION STRUCTURE

(75) Inventors: Eun-Jung Yun, Seoul (KR); Sung-Eui Kim, Suwon-si (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 10/617,742

(22) Filed: Jul. 14, 2003

(65) Prior Publication Data

US 2004/0032006 A1 Feb. 19, 2004

(30) Foreign Application Priority Data

Aug. 19, 2002 (KR) .................................... 2002-48978

(51) Int. Cl.[7] .......................... H01L 29/00; H01L 21/76
(52) U.S. Cl. .................... 257/506; 257/510; 257/513; 257/524; 431/427
(58) Field of Search ............................ 257/506, 510, 257/513, 524, 499–504; 438/437

(56) References Cited

U.S. PATENT DOCUMENTS

| | | | | |
|---|---|---|---|---|
| 4,740,480 A | * | 4/1988 | Ooka | 438/436 |
| 4,871,689 A | * | 10/1989 | Bergami et al. | 438/427 |
| 4,952,524 A | * | 8/1990 | Lee et al. | 438/437 |
| 5,332,920 A | * | 7/1994 | Nakagawa et al. | 257/501 |
| 5,410,176 A | * | 4/1995 | Liou et al. | 257/49 |
| 5,702,977 A | * | 12/1997 | Jang et al. | 216/38 |
| 5,872,043 A | * | 2/1999 | Chen | 438/424 |
| 6,057,209 A | * | 5/2000 | Gardner et al. | 438/427 |
| 6,110,800 A | * | 8/2000 | Chou | 438/431 |
| 6,140,208 A | | 10/2000 | Agahi et al. | 438/437 |
| 6,258,692 B1 | * | 7/2001 | Chu et al. | 438/400 |
| 6,313,331 B1 | * | 11/2001 | Cavell et al. | 556/18 |
| 6,436,833 B1 | * | 8/2002 | Pang et al. | 438/692 |
| 6,473,186 B2 | * | 10/2002 | Kawasaki et al. | 356/512 |
| 6,642,125 B2 | * | 11/2003 | Oh et al. | 438/427 |
| 6,756,654 B2 | * | 6/2004 | Heo et al. | 257/510 |
| 2002/0070420 A1 | * | 6/2002 | Oh et al. | 257/506 |
| 2003/0013270 A1 | * | 1/2003 | Seitz | 438/424 |
| 2004/0032006 A1 | * | 2/2004 | Yun et al. | 257/510 |
| 2004/0266131 A1 | * | 12/2004 | Kawasaki et al. | 438/424 |

FOREIGN PATENT DOCUMENTS

| | | |
|---|---|---|
| JP | 8-97277 | 4/1996 |
| KR | 2000-0052287 | 8/2000 |

* cited by examiner

*Primary Examiner*—Jerome Jackson
*Assistant Examiner*—Jesse A. Fenty
(74) *Attorney, Agent, or Firm*—Lee & Morse, P.C.

(57) ABSTRACT

A trench structure of a semiconductor device includes first and second regions of a substrate having first and second trenches, respectively, the first trench having an aspect ratio larger than that of the second trench, a first insulation material on a bottom and sidewalls of the first trench forming a first sub-trench in the first trench, a second insulation material completely filling the first sub-trench, a third insulation material formed on a bottom and sidewalls of the second trench forming a second sub-trench in the second trench, a fourth insulation material formed on a bottom and sidewalls of the second sub-trench, and a fifth insulation material completely filling a third sub-trench formed in the second sub-trench by the fourth insulation material.

7 Claims, 7 Drawing Sheets

SEMICONDUCTOR TRENCH ISOLATION STRUCTURE

BACKGROUND OF THE INVENTION

1. Field of the Invention

The present invention relates to a trench structure and method of forming the same. More particularly, the present invention relates to a trench structure for the isolation of a semiconductor device and a method of forming the same.

2. Description of the Related Art

Because semiconductor devices are being developed to have high integration densities, a method of isolating semiconductor devices with excellent insulation characteristics in a minute area of the semiconductor device is required. Generally, isolation of semiconductor devices is achieved by a local oxidation of silicon (LOCOS) process or a trench isolation process.

Good semiconductor device isolation characteristics may be obtained simply with the LOCOS process. However, the LOCOS process requires a wider isolation area than the trench isolation process, and defects such as a bird's beak commonly occur during the LOCOS process. Thus, the trench isolation process is widely used for the isolation of semiconductor devices.

In the trench isolation process, a trench is formed in a substrate using a nitride film as an etching mask. Then, the trench is filled with a filling insulation material such as an oxide. Finally, a chemical-mechanical polishing (CMP) process is performed for forming a trench structure.

According to the prior art, a trench isolation method may include isolating a semiconductor device in a trench by forming a trench structure in a substrate and successively forming a thermal oxidation film, a chemical vapor deposition (CVD) oxide film, a liner layer and an insulation film in the trench in order to minimize the generation of a dent in the substrate.

In addition, there is known in the art a method of successively forming a thermal oxidation film, an insulation oxide film, a liner layer and an insulation film for the isolation of a semiconductor device in a trench when a trench structure is formed in a substrate in order to reduce parasitic leakage and hot carrier degradation.

The methods described above for forming a trench structure provide good isolation properties. However, although the trench structure has excellent isolation characteristics, a void is frequently generated in a trench when the trench structure is formed. In particular, voids are more frequently and acutely generated when trench structures are continuously formed in trenches having different aspect ratios.

FIG. 1 illustrates a cross-sectional view showing trench structures formed according to a conventional method. In FIG. 1, a substrate 10 is divided into a cell region, where devices such as trench structures are formed, and a peripheral region, where a connection wiring for the devices in the cell region is positioned.

Referring to FIG. 1, a trench 14a in the cell region has an aspect ratio different from an aspect ratio of a trench 14b in the peripheral region. In this case, the aspect ratio of the trench 14a in the cell region is twice that of the trench 14b in the peripheral region. When the trench structure is formed, however, the trench 14a in the cell region has a structure that is identical to that of the trench 14b in the peripheral region. That is, a filling structure 12a that fills the trench 14a in the cell region has a structure identical to that of a filling structure 12b that fills the trench 14b in the peripheral region. A void 16 is frequently generated in the trench structure in the cell region because identical filling structures 12a and 12b are used to fill the trenches 14a and 14b even though the trenches 14a and 14b have different aspect ratios. FIG. 1 illustrates the previously described condition of frequent void generation in trench structures occurring when the trench structures are continuously formed in cell and peripheral regions of a substrate. Such generation of voids may result in the deterioration of the semiconductor device operating characteristics. Hence, it is greatly required that a trench structure for semiconductor device isolation be formed without the generation of voids therein.

SUMMARY OF THE INVENTION

In an effort to solve the afore-mentioned problems, it is a first feature of an embodiment of the present invention to provide trench structures having different constructions in a cell region and a peripheral region of a substrate.

It is a second feature of an embodiment of the present invention to provide a method of forming trench structures having different constructions in a cell region and a peripheral region of a substrate.

In order to achieve the first feature of an embodiment of the present invention, there is provided a trench structure of a semiconductor device including a first region of a substrate having a first trench, the first trench having a first aspect ratio, a first filling element having a first insulation material continuously formed on a bottom face and on a sidewall of the first trench, and a second insulation material completely filling a first sub-trench formed in the first trench by the formation of the first insulation material, a second region of the substrate having a second trench, the second trench having a second aspect ratio smaller than the first aspect ratio, and a second filling element having a third insulation material continuously formed on a bottom face and sidewalls of the second trench, a fourth insulation material formed on a bottom face and sidewalls of a second sub-trench formed in the second trench by the formation of the third insulation material, and a fifth insulation material completely filling a third sub-trench formed in the second sub-trench by the formation of the fourth insulation material.

The first aspect ratio may be at least about twice the second aspect ratio. The first insulation material may be identical to the third and the fifth insulation materials, and may include an oxide. The second insulation material may be identical to the fourth insulation material, and may include a silicon-containing material. Preferably, the first trench is formed in a cell region of the substrate, and the second trench is formed in a peripheral region of the substrate.

To provide the second feature of an embodiment of the present invention, there is provided a method of forming trench structures of a semiconductor device including successively forming a pad oxide film and a hard mask on a substrate, successively etching the hard mask and the pad oxide film to form a first hard mask pattern, a second hard mask pattern, a first pad oxide pattern, and a second pad oxide pattern to form a first contact having a first width corresponding to the first hard mask pattern and the first pad oxide pattern, and a second contact having a second width wider than the first width corresponding to the second hard mask pattern and the second pad oxide pattern, forming a first trench having a first aspect ratio under the first contact, and forming a second trench having a second aspect ratio smaller than the first aspect ratio under the second contact by etching portions of the substrate exposed through the first and the second contacts, continuously forming a first insulation material on the first trench, the second trench and the substrate, continuously forming a second insulation material on the first insulation material wherein the first trench is completely filled with the second insulation material, forming a third insulation material on the second insulation material wherein the second trench is completely filled with the third insulation material, successively removing the third insulation material, the second insulation material and the first insulation material to expose surfaces of the first and second hard mask patterns, removing the first and second hard mask patterns, and removing the first pad oxide pattern, the second pad oxide pattern, the first insulation material remaining on the substrate, the second insulation material remaining on the substrate, and the third insulation material remaining on the substrate to form a first trench structure and a second trench structure on the substrate.

The first aspect ratio is preferably at least about twice the second aspect ratio. The first trench is preferably formed in a cell region of the substrate, and the second trench is preferably formed in a peripheral region of the substrate. The first and the third insulation materials may include an oxide, which may further include a high density plasma oxide, TEOS or USG. The second insulation material preferably includes un-doped silicon or silicon nitride, and may be formed by a low pressure chemical vapor deposition process.

According to the present invention, trenches having different aspect ratios in a substrate are filled with different trench structures, thereby allowing formation of a trench structure in a trench having a relatively high aspect ratio without generation of a void therein.

BRIEF DESCRIPTION OF THE DRAWINGS

The above features and advantages of the present invention will become more apparent to those of ordinary skill in the art by describing in detail preferred embodiments thereof with reference to the attached drawings in which.

DESCRIPTION OF THE PREFERRED EMBODIMENTS

Figure 1:
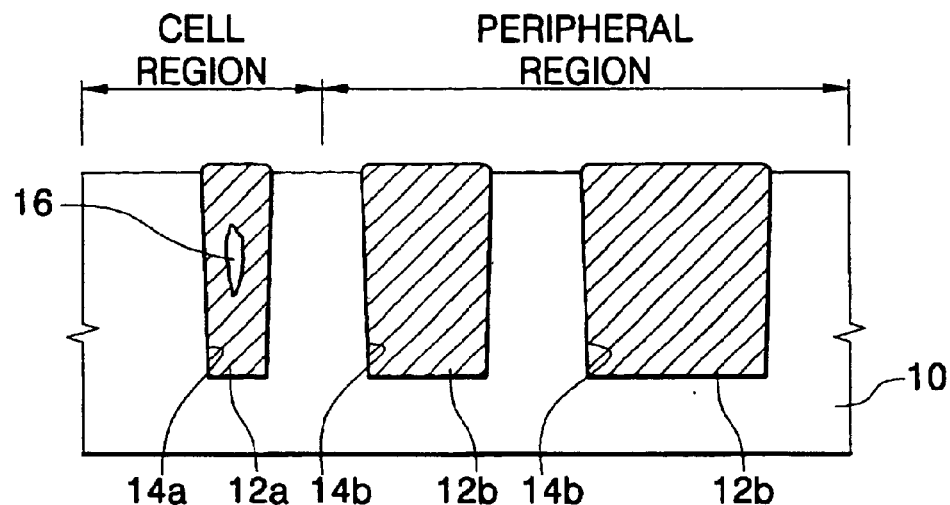
FIG. 1 illustrates a cross-sectional view of trench structures formed according to a conventional method.

Korean Patent Application No. 2002-48978 filed on Aug. 19, 2002, and entitled: "Trench Structure And Method Of Forming The Same," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity, and like reference numerals denote like elements throughout.

Figure 2:
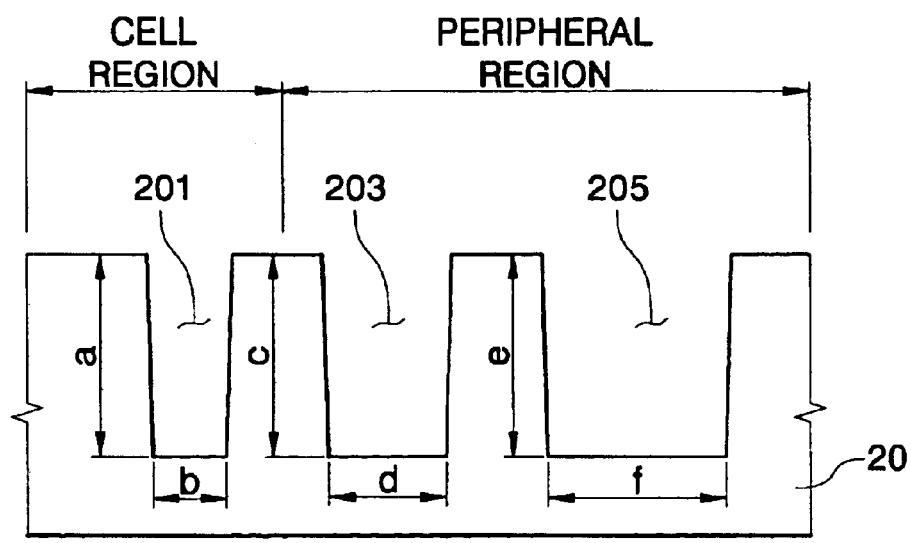
FIG. 2 illustrates a cross-sectional view of trenches formed in a substrate according to a preferred embodiment of the present invention.

FIG. 2 illustrates a cross-sectional view of a substrate including a trench formed therein according to a preferred embodiment of the present invention.

Referring to FIG. 2, a substrate 20 is divided into a cell region and a peripheral region. A first trench 201 is formed in the cell region of the substrate 20, and second and third trenches 203 and 205 are formed in the peripheral region of the substrate 20. The trenches 201, 203 and 205 have different aspect ratios.

The aspect ratio of the first trench 201 is represented as a/b, the aspect ratio of the second trench 203 is represented as c/d and the aspect ratio of the third trench 205 is represented as e/f. In this case, a, c and e are equal, d is greater than b, and f is greater than d. Thus, a/b is greater than c/d, and c/d is greater than e/f, meaning the aspect ratio of the first trench 201 is greater than the aspect ratios of the second and third trenches 203 and 205. Therefore, the first trench 201 in the cell region has a greater aspect ratio than the second and third trenches 203 and 205 in the peripheral region. Additionally, in the recent art, the first trench 201 in the cell region generally has an aspect ratio about twice that of the second the third trenches 203 and 205 in the peripheral region.

Figure 3:
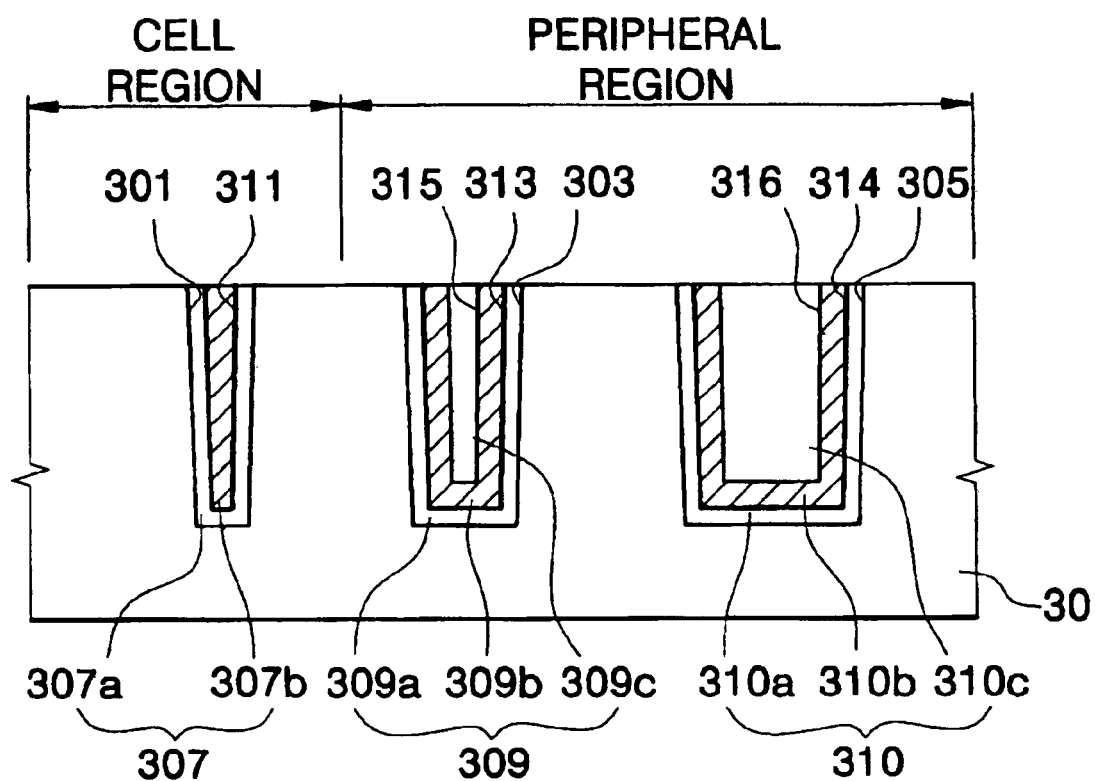
FIG. 3 illustrates a cross-sectional view of trench structures formed in a substrate according to a preferred embodiment of the present invention.

FIG. 3 illustrates a cross-sectional view showing trench structures formed in a substrate according to a preferred embodiment of the present invention.

Referring to FIG. 3, a first filling element 307 is filled in a first trench 301 formed in a cell region of a substrate 30. A second filling element 309 is filled in a second trench 303 formed in a peripheral region of the substrate 30, and a third filling element 310 is filled in a third trench 305 formed in the peripheral region of the substrate 30.

The first filling element 307 includes a first insulation material 307a and a second insulation material 307b. The first insulation material 307a is continuously formed on the bottom face and the sidewalls of the first trench 301 in the cell region. A first sub-trench 311 is formed in the first trench 301 by the first insulation material 307a, and the second insulation material 307b completely fills up the first sub-trench 311.

The second filling element 309 includes a third insulation material 309a, a fourth insulation material 309b, and a fifth insulation material 309c. The third insulation material 309a is continuously formed on the bottom face and the sidewalls of the second trench 303. The fourth insulation material 309b is successively formed on the bottom face and the sidewalls of a second sub-trench 313 formed by the third insulation material 309a, and the fifth insulation material 309c completely fills up a third sub-trench 315 formed by the fourth insulation material 309b.

The third filling element 310 includes a sixth insulation material 310a, a seventh insulation material 310b, and an eighth insulation material 310c. The sixth insulation material 310a is continuously formed on the bottom face and the sidewalls of the third trench 305, and the seventh insulation material 310b is successively formed on the bottom face and the sidewalls of a fourth sub-trench 314 formed by the sixth insulation material 310a. The eighth insulation material 310c completely fills up a fifth sub-trench 316 formed by the seventh insulation material 310b.

The first insulation material 307a, the third insulation material 309a and the fifth insulation material 309c preferably include an oxide film. Also, the sixth and eighth insulation materials 310a and 310c preferably include oxide films that are the same as in the first insulation material 307a. For example, the oxide film may include a high density plasma (HDP) oxide film, a thermal oxide film, a tetraethylorthosilicate (TEOS) film, or an un-doped silicate glass (USG) film.

In the mean time, the second insulation material 307b preferably includes a silicon-containing material, and the fourth insulation material 309b preferably includes a silicon containing material that is the same as that of the second insulation material 307b. In addition, the seventh insulation material 310b preferably includes a silicon-containing material that is the same as in the second insulation material 307b. For example, the silicon-containing material may include an un-doped silicon film or a silicon nitride film. In particular, the silicon-containing material is preferably formed through a low pressure chemical vapor deposition (LPCVD) process.

Hereinafter, a method of forming trench structures according to a preferred embodiment of the present invention will be described.

FIGS. 4A to 4I illustrate cross-sectional views for showing a method of forming trench structures according to a preferred embodiment of the present invention.

Figure 4A:
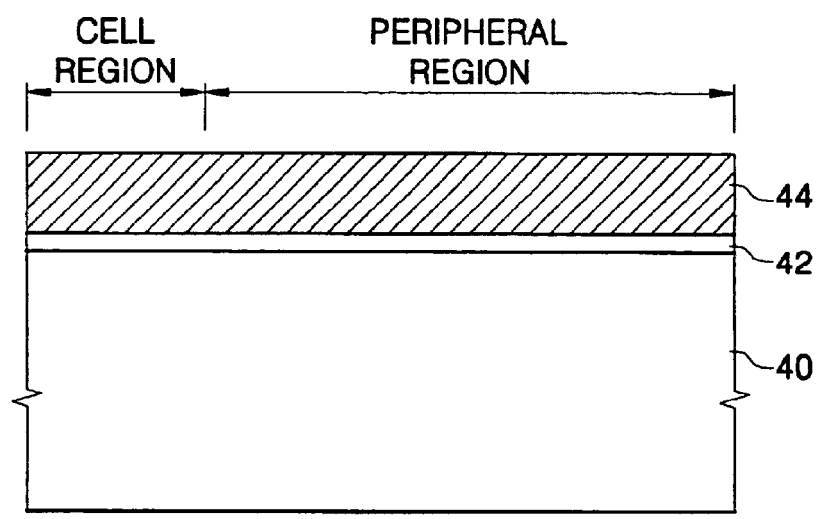
FIGS. 4A to 4I illustrate cross-sectional views of a method of forming trench structures of a semiconductor device according to a preferred embodiment of the present invention.

Referring to FIG. 4A, a pad oxide film 42 and a hard mask 44 are successively formed on a substrate 40, which is divided into a cell region and a peripheral region. The pad oxide film 42 is preferably formed through a thermal oxidation process to have a thickness of approximately 100 to 400 Å. The hard mask 44 is preferably formed through an LPCVD process to have a thickness of approximately 500 to 1,000 Å.

Figure 4B:
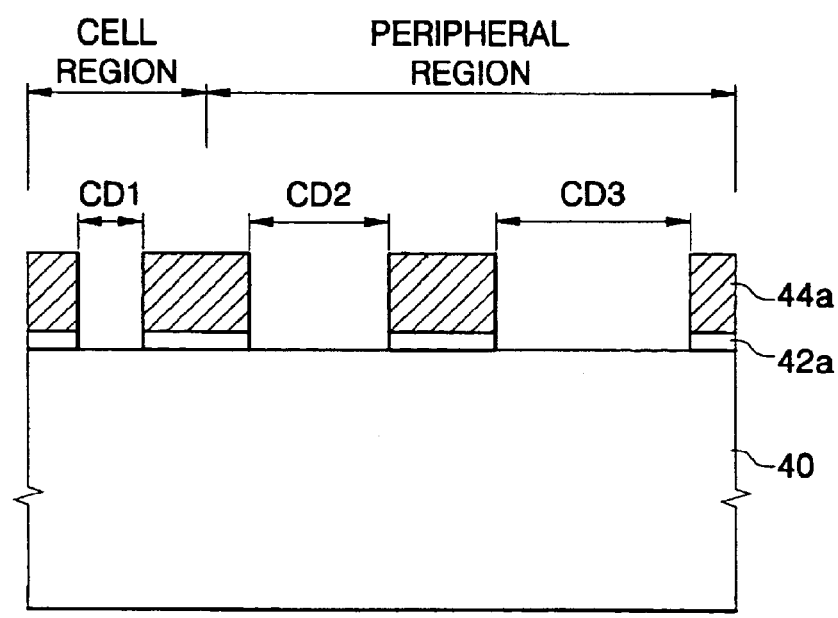

Referring to FIG. 4B, the hard mask 44 and the pad oxide film 42 are successively etched to form a hard mask pattern 44a and a pad oxide pattern 42a. The hard mask pattern 44a and the pad oxide pattern 42a are formed by a photolithography process in which a photoresist pattern is used as an etching mask.

When the hard mask pattern 44a and the pad oxide pattern 42a are formed, portions of the substrate 40 are exposed. In this case, the line width CD1 between the patterns 44a and 42a in the cell region is narrower than the line widths CD2 and CD3 between the patterns 44a and 42a in the peripheral region because the isolation margin in the cell region is smaller than the isolation margin in the peripheral region.

Figure 4C:
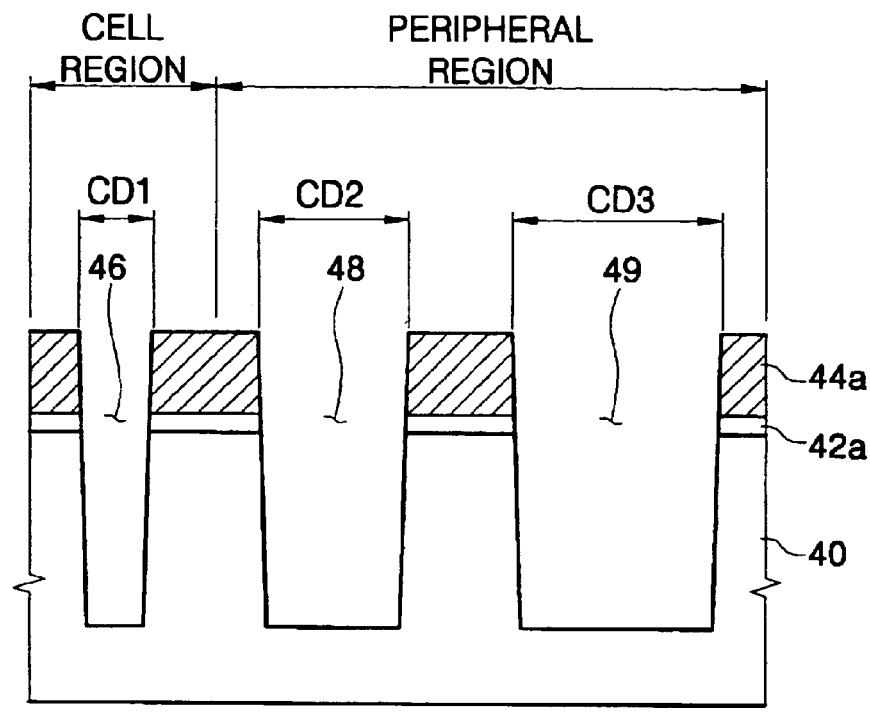

Referring to FIG. 4C, first, second and third trenches 46, 48 and 49 are formed in the substrate 40 by etching the substrate 40 using the hard mask pattern 44a and the pad oxide pattern 42a as etching masks. The first, second and third trenches 46, 48 and 49 preferably have equal depths of approximately 0.25 to 0.35 $\mu$m, respectively. The first trench 46, formed in the cell region, has a depth identical to the depths of the second and third trenches 48 and 49, formed in the peripheral region. However, because the width CD1 of the first trench 46 in the cell region is smaller than the widths CD2 and CD3 of the second and the third trenches 48 and 49 in the peripheral region, the aspect ratio of the first trench 46 in the cell region is greater than the aspect ratios of the second and the third trenches 48 and 49 in the peripheral region.

Figure 4D:
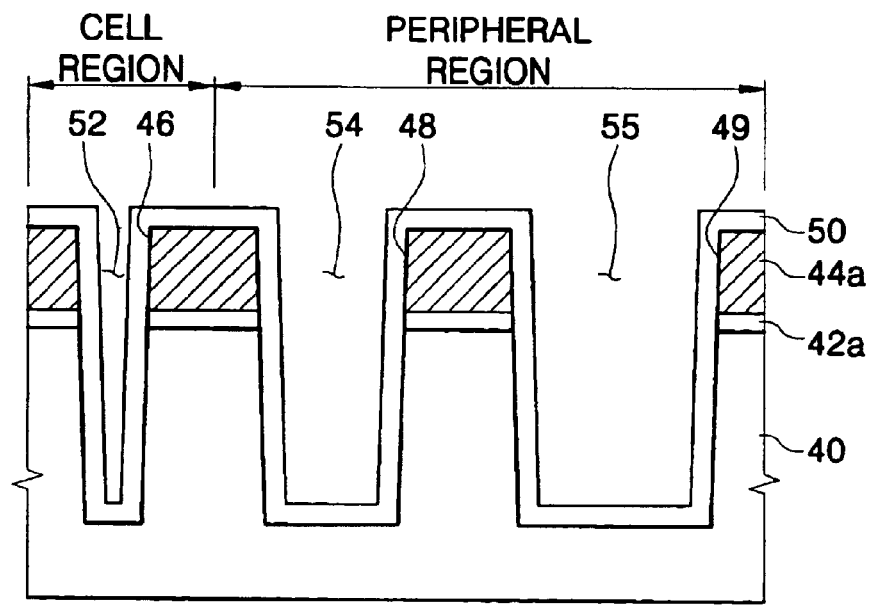

Referring to FIG. 4D, a first oxide film 50 is continuously formed on the bottom faces and the sidewalls of the first, second and third trenches 46, 48 and 49 in the cell and the peripheral regions. The first oxide film 50 is also formed on the hard mask pattern 44a. Preferably, the first oxide film 50 includes an HDP oxide film formed by a chemical vapor deposition process. With the formation of the first oxide film 50, a first sub-trench 52 is formed in the first trench 46 in the cell region, and second and third sub-trenches 54 and 55 are respectively formed in the second and third trenches 48 and 49 in the peripheral region.

Figure 4E:
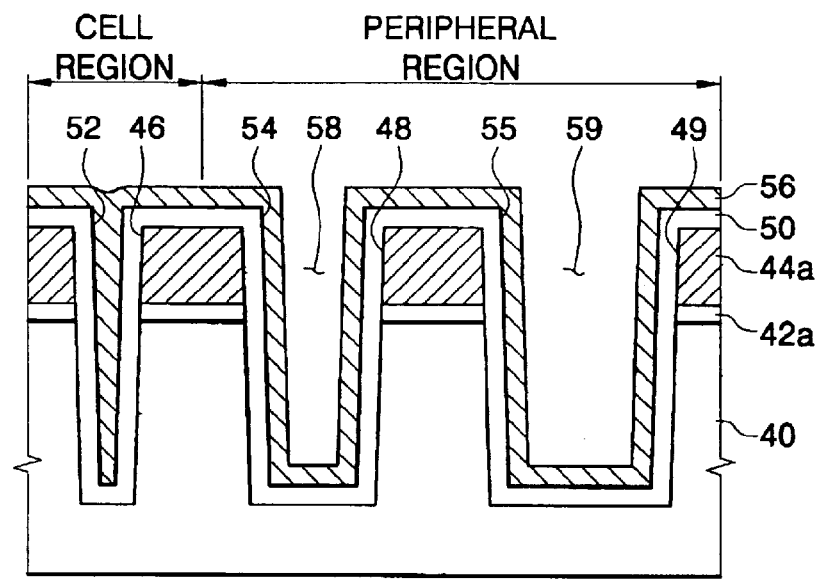

Referring to FIG. 4E, a silicon nitride film 56 is formed on the first oxide film 50 by an LPCVD process. Because the silicon nitride film 56 is formed by the LPCVD process, the silicon nitride film 56 has good reflowablility to completely fill up the first sub-trench 52 in the cell region. However, the second and third sub-trenches 54 and 55 are not completely filled with the silicon nitride film 56 because the second and third sub-trenches 54 and 55 have smaller aspect ratios than the first sub-trench 52. That is, the silicon nitride film 56 is continuously formed on the bottom faces and the sidewalls of the second and the third sub-trenches 54 and 55.

The first trench 46 in the cell region is filled with a first filling element including the first oxide film 50 and the silicon nitride film 56, while fourth and fifth sub-trenches 58 and 59 are respectively formed in the second and third sub-trenches 54 and 55 in the peripheral region by the formation of the silicon nitride film 56.

Figure 4F:
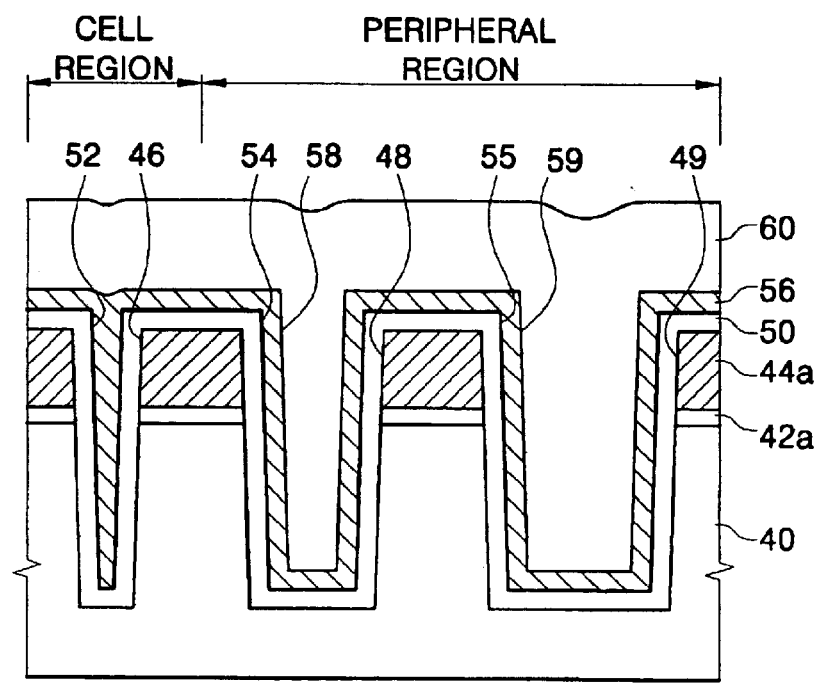

Referring to FIG. 4F, a second oxide film 60 is formed on the silicon nitride film 56. The second oxide film 60 preferably includes an HPD oxide film formed by a chemical vapor deposition process. As a result, the fourth and fifth sub-trenches 58 and 59 are completely filled with the second oxide film 60. That is, the second and third trenches 48 and 49 are completely filled with second and third filling elements including the first oxide film 50, the silicon nitride film 56 and the second oxide film 60.

Figure 4G:
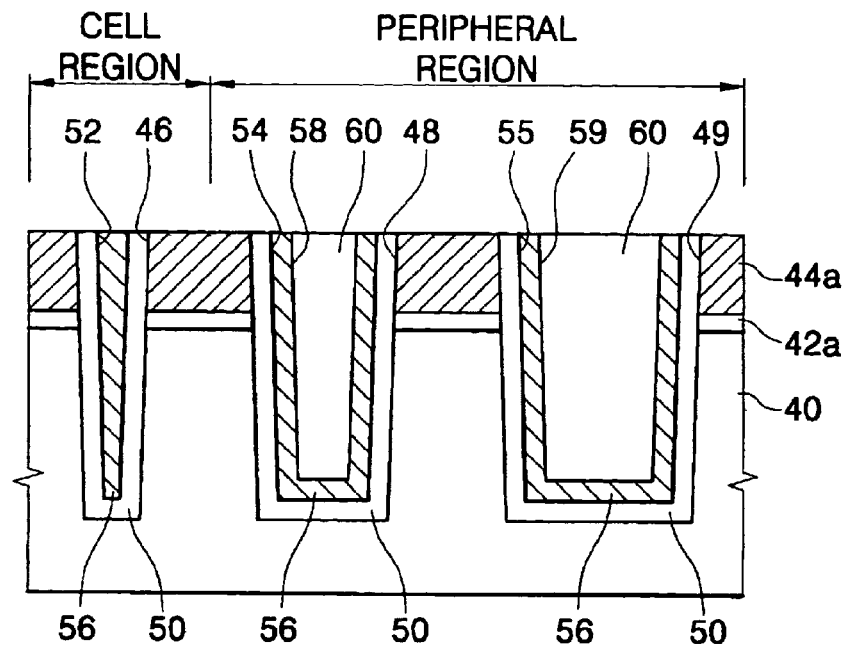

Referring to FIG. 4G, the second oxide film 60, the silicon nitride film 56 and the first oxide film 50 are successively polished by a chemical-mechanical polishing (CMP) process, and the hard mask pattern 44a serves as a polishing stop layer when the CMP process is executed.

Figure 4H:
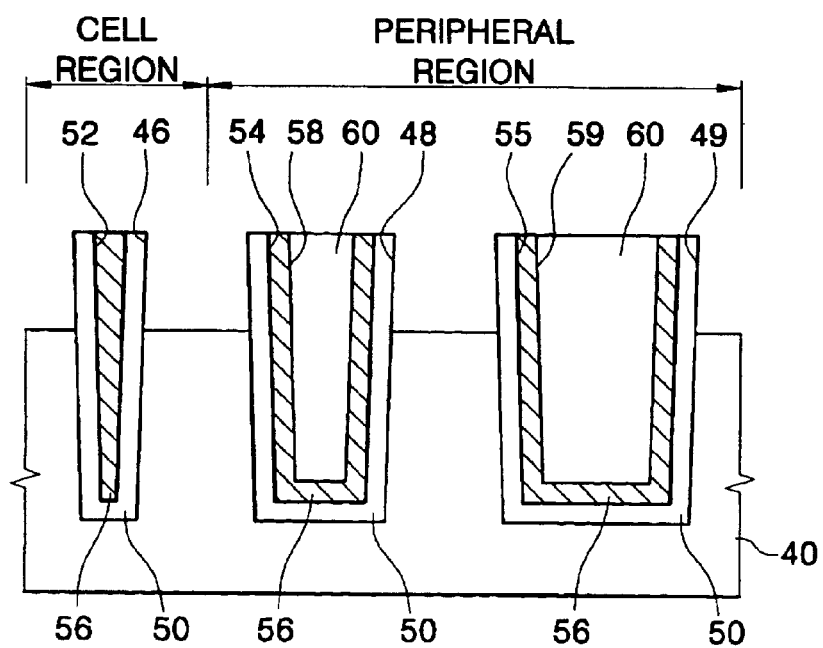

Referring to FIG. 4H, the hard mask pattern 44a and the pad oxide pattern 42a are removed. The hard mask pattern 44a and the pad oxide pattern 42a may be etched by a dry etching or a wet etching process, and are preferably removed by the wet etching process. Removal of the hard mask pattern 44a and the pad oxide pattern 42a causes the first, second and third filling elements to protrude from the substrate 40.

Figure 4I:
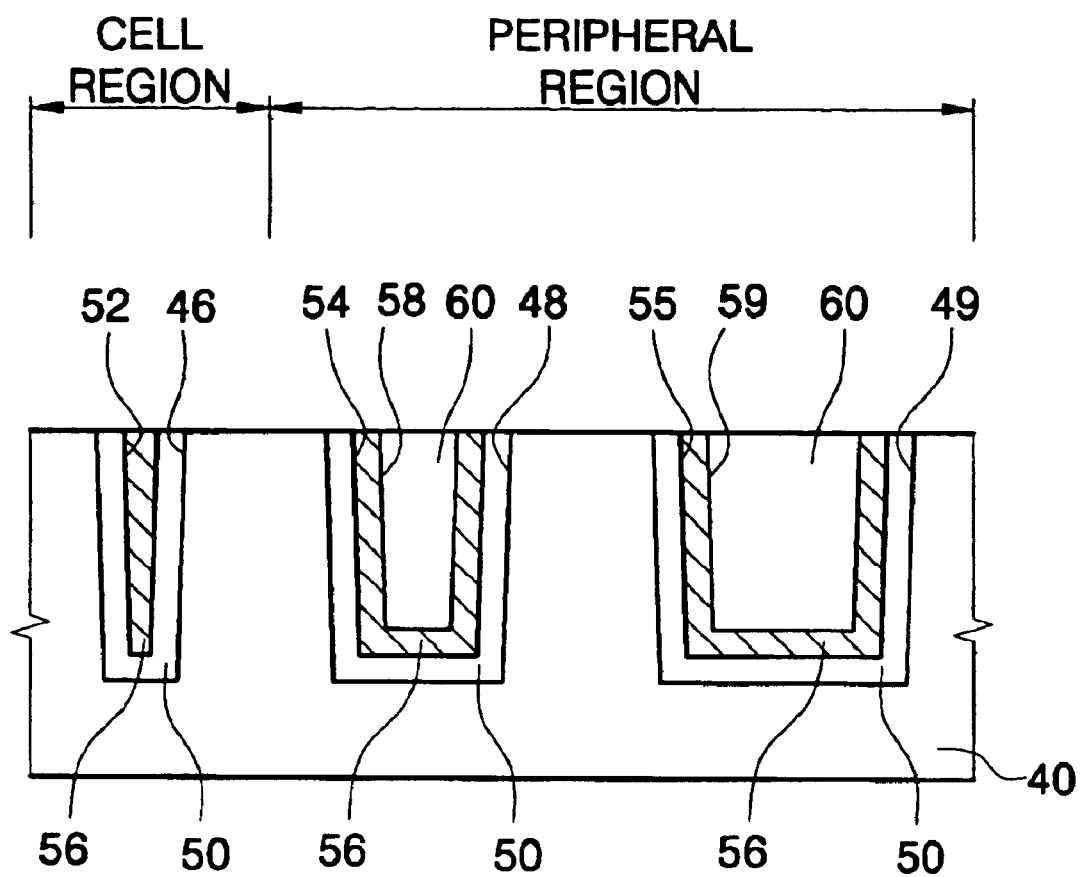

Referring to FIG. 4I, the first, second and third filling elements that are protruding form the substrate are polished by the CMP process when the surface of the substrate 40 is exposed. As a result, the first, second and third trench structures are formed in the cell and the peripheral regions of the substrate 40.

According to the method described above, the trench structure formed in the cell region is different from the trench structures formed in the peripheral region. That is, the trench structure in the cell region includes the first oxide film 50 and the silicon nitride film 56, whereas the trench structures in the peripheral region include the first oxide film 50, the silicon nitride film 56 and the second oxide film 60. Therefore, the trenches may be formed without the generation of voids therein. Particularly, void formation in the first trench 46 in the cell region may be effectively prevented because the first oxide film 50 and the silicon nitride film 56 fill the first trench 46, which has an aspect ratio larger than the aspect ratios of the second and third trenches 48 and 49 in the peripheral region. The present invention provides the additional advantage of easy in-situ formation of the trench structures for filling the trenches in the cell and the peripheral regions of a substrate.

It has been shown that by the present invention, when trenches having different aspect ratios are formed in a semiconductor substrate, different trench structures are formed in the trenches depending on the aspect ratio of the trench. By using different trench structures for trenches with different aspect ratios, the trench structures may be formed without the generation of voids therein. In particular, a trench having a relatively high aspect ratio may be filled with a void-free trench structure. As a result, failure caused by voids may be effectively prevented, and the reliability of a semiconductor device may be improved. In addition, void-free trench structure formation, particularly when combined with easy in-situ formation thereof, serves to enhance the yield of the semiconductor device manufacturing process.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A trench structure of a semiconductor device comprising:

a first region of a substrate having a first trench, the first trench having a first aspect ratio;

a first filling element having a first insulation material continuously formed on a bottom face and sidewalls of the first trench, and a second insulation material completely filling a first sub-trench formed in the first trench by the formation of the first insulation material;

a second region of the substrate having a second trench, the second trench having a second aspect ratio smaller than the first aspect ratio; and a second filling element having a third insulation material continuously formed on a bottom face and sidewalls of the second trench, a fourth insulation material formed on a bottom face and sidewalls of a second sub-trench formed in the second trench by the formation of the third insulation material, and a fifth insulation material completely filling a third sub-trench formed in the second sub-trench by the formation of the fourth insulation material.

2. The trench structure of a semiconductor device as claimed in claim 1, wherein the first aspect ratio is at least about twice the second aspect ratio.

3. The trench structure of a semiconductor device as claimed in claim 1, wherein the first insulation material is identical to the third and fifth insulation materials.

4. The trench structure of a semiconductor device as claimed in claim 3, wherein the first, third and fifth insulation materials include an oxide.

5. The trench structure of a semiconductor device as claimed in claim 1, wherein the second insulation material is identical to the fourth insulation material.

6. The trench structure of a semiconductor device as claimed in claim 5, wherein the second and fourth insulation materials include a silicon-containing material.

7. The trench structure of a semiconductor device as claimed in claim 1, wherein the first trench is formed in a cell region of the substrate, and the second trench is formed in a peripheral region of the substrate.

* * * * *